(12) United States Patent
Choi et al.

(10) Patent No.: US 10,707,234 B2
(45) Date of Patent: Jul. 7, 2020

(54) SEMICONDUCTOR DEVICE AND METHOD OF FABRICATING THE SAME

(71) Applicant: Samsung Electronics Co., Ltd., Suwon-si (KR)

(72) Inventors: Hoon-Sung Choi, Suwon-si (KR); Dong-Il Park, Hwaseong-si (KR); Yuri Masuoka, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/204,637

(22) Filed: Nov. 29, 2018

(65) Prior Publication Data

US 2019/0348438 A1 Nov. 14, 2019

(30) Foreign Application Priority Data

May 8, 2018 (KR) .......................... 10-2018-0052482

(51) Int. Cl.
*H01L 27/12* (2006.01)
*H01L 21/8234* (2006.01)
*H01L 21/84* (2006.01)
*H01L 27/092* (2006.01)

(52) U.S. Cl.
CPC .. *H01L 27/1203* (2013.01); *H01L 21/823481* (2013.01); *H01L 21/84* (2013.01); *H01L 27/092* (2013.01)

(58) Field of Classification Search
CPC ............... H01L 27/1203; H01L 27/092; H01L 21/823481; H01L 21/84

USPC ......................................................... 257/348
See application file for complete search history.

(56) References Cited

U.S. PATENT DOCUMENTS

| | | | |
|---|---|---|---|
| 8,410,534 B2 | 4/2013 | Voldman | |
| 8,587,086 B2 | 11/2013 | Cheng et al. | |
| 8,652,888 B2* | 2/2014 | Cheng | H01L 21/84 |
| | | | 438/155 |
| 8,835,330 B2 | 9/2014 | Chen et al. | |
| 9,147,695 B2* | 9/2015 | Hasbani | H01L 29/78648 |
| 9,202,864 B2 | 12/2015 | Cai et al. | |
| 9,214,400 B2 | 12/2015 | Zhu et al. | |
| 9,601,511 B2 | 3/2017 | Vinet et al. | |
| 2017/0125403 A1* | 5/2017 | Kim | H01L 29/6609 |

FOREIGN PATENT DOCUMENTS

JP 5049691 A 2/2009

* cited by examiner

*Primary Examiner* — Vu A Vu
(74) *Attorney, Agent, or Firm* — Muir Patent Law, PLLC

(57) ABSTRACT

A semiconductor device comprises: a substrate; a first well region of a first conductivity type and a second well region of a second conductivity type formed horizontally adjacent to each other in the substrate; a buried insulation layer formed on the first well region and the second well region; a first semiconductor layer formed to vertically overlap the first well region, and a second semiconductor layer formed to vertically overlap the second well region, on the buried insulation layer; a first isolation layer formed between the first semiconductor layer and the second semiconductor layer on the buried insulation layer; and a conductive layer formed on the first semiconductor layer and the second semiconductor layer to extend over the first semiconductor layer and the second semiconductor layer.

20 Claims, 13 Drawing Sheets

SEMICONDUCTOR DEVICE AND METHOD OF FABRICATING THE SAME

BACKGROUND

1. Field

The present disclosure relates to a semiconductor device and a method of fabricating the same, and more specifically, to a semiconductor device including FD-SOI (Fully Depleted Silicon On Insulator) and a method of fabricating the same.

2. Description of the Related Art

Recent semiconductor elements have developed in a direction that enables a high-speed operation at low voltage, and the fabricating process of these semiconductor elements has been developed in the direction in which a degree of integration is improved. Therefore, patterns of the highly-scaled, highly integrated semiconductor elements may be spaced apart from each other at fine pitches with a fine width.

A FD-SOI (Fully Depleted Silicon On Insulator) process has been developed in which a buried insulation layer is formed on a substrate and a channel and a transistor are formed on the buried insulation layer during a miniaturization process of the semiconductor element. The FD-SOI process has an effect of reducing the parasitic capacitance and the leakage current by fully depleting the channel in the lower part of the transistor.

SUMMARY

An aspect of the present inventive concepts provide a semiconductor device having an FD-SOI structure with increased area efficiency.

Another aspect of the present inventive concepts provide a method of fabricating a semiconductor device having an FD-SOI structure with increased area efficiency.

According to some aspects of the present inventive concepts, a semiconductor device comprises: a substrate; a first well region of a first conductivity type and a second well region of a second conductivity type formed horizontally adjacent to each other in the substrate; a buried insulation layer formed on the first well region and the second well region; a first semiconductor layer formed to vertically overlap the first well region, and a second semiconductor layer formed to vertically overlap the second well region, on the buried insulation layer; a first isolation layer formed between the first semiconductor layer and the second semiconductor layer on the buried insulation layer; and a conductive layer formed on the first semiconductor layer and the second semiconductor layer to extend over the first semiconductor layer and the second semiconductor layer.

According to some aspects of the present inventive concepts, which may include the aforementioned aspects, a semiconductor device comprises: a substrate; a first well region of a first conductivity type and a second well region of a second conductivity type formed horizontally adjacent to each other on the substrate; a buried insulation layer formed on the first well region and the second well region; a first semiconductor layer formed to vertically overlap the first well region and a second semiconductor layer formed to vertically overlap the second well region on the buried insulation layer, the first semiconductor layer and the second semiconductor layer being sequentially disposed adjacent to each other in a first direction; a gate structure extending in the first direction on the first semiconductor layer and the second semiconductor layer; a first isolation layer including at least a portion formed on a first side of the gate structure when viewed from a top down view, the first element isolation layer separating the first semiconductor layer and the second semiconductor layer from each other; and a conductive layer which extends over the first semiconductor layer and the second semiconductor layer and is formed on a second, opposite side of the gate structure.

According to some aspects of the present inventive concepts, which may include the aforementioned aspects, a method of fabricating a semiconductor device, the method comprises: forming a first well region of a first conductivity type and a second well region of a second conductivity type horizontally adjacent to each other in a substrate; forming a buried insulation layer on the first well region and the second well region; forming a first semiconductor layer and a second semiconductor layer on the buried insulation layer, the first semiconductor layer vertically overlapping the first well region, and the second semiconductor layer vertically overlapping the second well region; forming a trench between the first semiconductor layer and the second semiconductor layer, filling the trench to form a first isolation layer which separates at least a part of the first semiconductor layer and the second semiconductor layer; and forming a conductive layer on the first semiconductor layer and the second semiconductor layer to extend over the first semiconductor layer and the second semiconductor layer.

Aspects of the present inventive concepts are not limited to those mentioned above and other aspects which is not mentioned may be clearly understood by those skilled in the art from the description below.

BRIEF DESCRIPTION OF THE DRAWINGS

The above and other aspects and features of the present inventive concepts will become more apparent by describing in detail exemplary embodiments thereof with reference to the attached drawings, in which.

DETAILED DESCRIPTION

Figure 1:
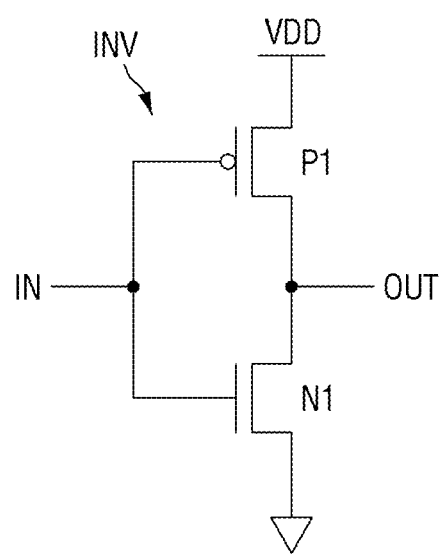
FIG. 1 is a circuit diagram of a semiconductor device according to some embodiments of the present inventive concepts.

FIG. 1 is a circuit diagram illustrating a semiconductor device according to some embodiments of the present inventive concepts. A semiconductor device, as described herein may be a semiconductor chip formed from a wafer, and may include an integrated circuit formed on a die that forms the semiconductor chip. The semiconductor chip may be, for example, a memory chip or a logic chip. The term "semiconductor device" may additionally refer to a semiconductor package, formed of one or more semiconductor chips on a package substrate and covered by a molding layer.

Referring to FIG. 1, the semiconductor device according to some embodiments of the present inventive concepts may include an inverter circuit INV.

Specifically, the inverter circuit INV inverts an input signal provided to an input terminal IN and provides the inverted signal to an output terminal OUT. The inverter circuit INV may have a CMOS (Complementary Metal Oxide Semiconductor) structure including a PMOS transistor P1 and an NMOS transistor N1.

A source terminal of the PMOS transistor P1 may be connected to a power supply voltage VDD terminal, and a drain terminal of the PMOS transistor P1 may be connected to the output terminal OUT and the drain terminal of the NMOS transistor N1. Also, the source terminal of the NMOS transistor N1 may be connected to a ground voltage (GND) terminal.

The semiconductor device according to some embodiments of the present inventive concepts will be described with reference to FIGS. 2 to 6.

Figure 2:
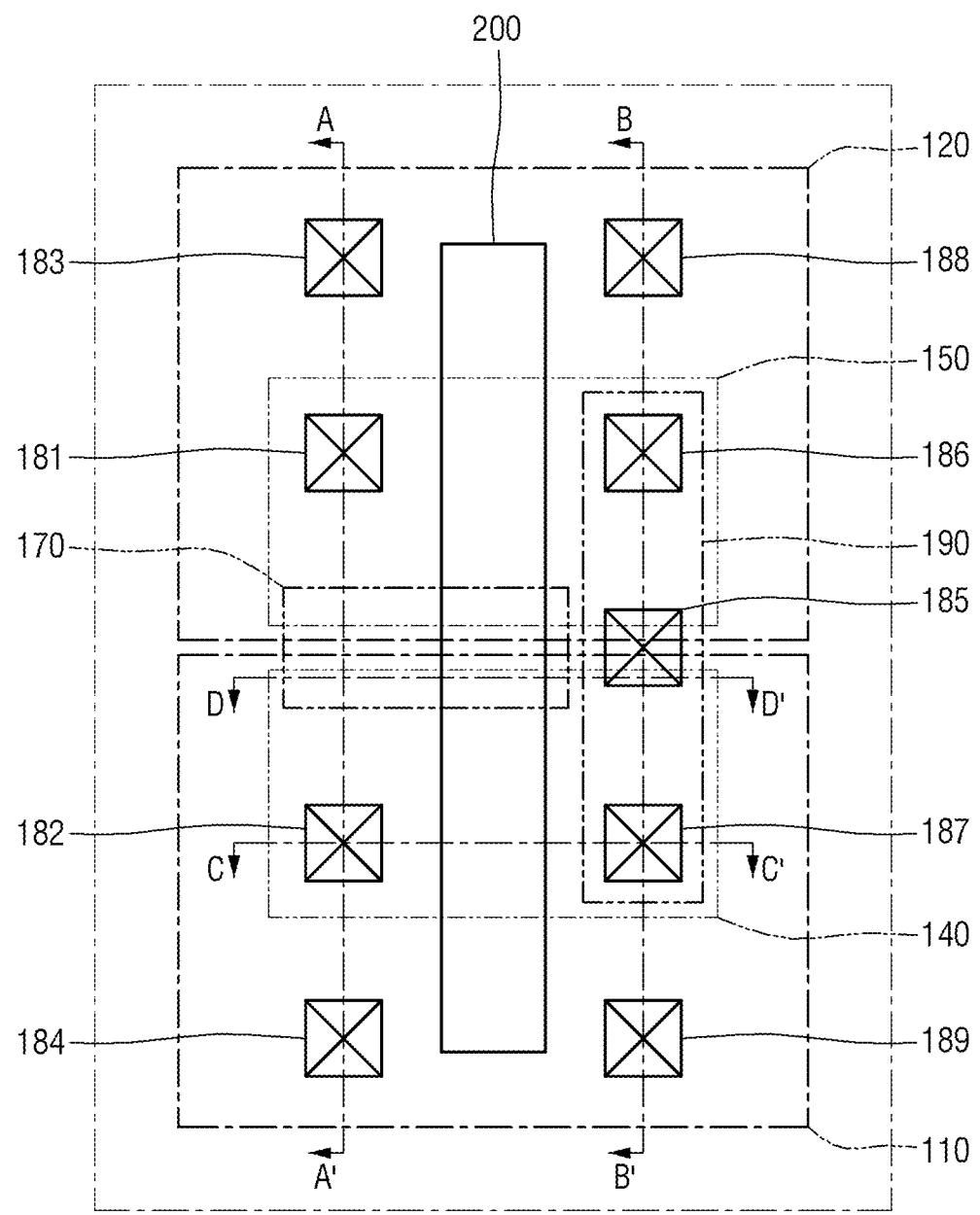
FIG. 2 is a conceptual plan view for explaining the semiconductor device according to some embodiments of the present inventive concepts.
Figure 2:
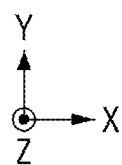

FIG. 2 is a conceptual plan view for explaining the semiconductor device according to some embodiments of the present inventive concepts, and FIGS. 3 to 6 are cross-sectional views taken along lines A-A', B-B', C-C' and D-D' of FIG. 2.

Referring to FIGS. 2 to 6, the semiconductor device according to some embodiments of the present inventive concepts may include a substrate 100, a first well region 110, a second well region 120, a buried insulation layer 130, a first semiconductor layer 140, a second semiconductor layer 150, a first element isolation layer 170, a gate structure 200 and the like.

The semiconductor device according to some embodiments of the present inventive concepts may be formed in an active region ACT of the substrate 100.

The substrate 100 may include, but is not limited to, a base substrate, and an epi-layer grown on the base substrate. The substrate 100 may include only the epi-layer without a base substrate. The substrate 100 may include a silicon substrate, a silicon germanium substrate, and the like, and the silicon substrate will be described as an example here.

As illustrated in FIGS. 3 to 6, the substrate 100 may be an SOI (Silicon on Insulator) substrate having an insulation layer formed on the silicon substrate. For example, the first well region 110 and the first semiconductor layer 140 inside the substrate 100 may be divided by the buried insulation layer 130. In some embodiments of the present inventive concepts, the substrate 100 may be formed by bonding a wafer including the first semiconductor layer 140 to an upper surface of the buried insulation layer 130 formed on the first well region 110, but it is not limited thereto. In this manner, the SOI substrate includes substrate 100, first well region 110 and second well region 120, buried insulating layer 130, first semiconductor layer 140, and second semiconductor layer 150.

The first well region 110 and the second well region 120 may be formed in the substrate 100. The first well region 110 and the second well region 120 may be sequentially arranged in the substrate 100 in one direction, which may be a first horizontal direction (e.g., the Y-direction of FIG. 2). In this manner, the first well region 110 and the second well region 120 may be horizontally adjacent to each other, and in some embodiments, may be directly adjacent to each other.

The first well region 110 and the second well region 120 may be formed to have different conductivity types from each other. Specifically, the first well region 110 may have a first conductivity type, and the second well region 120 may have a second conductivity type.

Therefore, as illustrated in FIG. 1, the first well region 110 may be formed of the N type (e.g., N type impurities doped into the semiconductor substrate material) and the second well region 120 may be formed of the P type (e.g., P type impurities doped into the semiconductor substrate material), but is the arrangement is not limited thereto. Conversely, the first well region 110 may be formed of the P type and the second well region 120 may be formed of the N type.

The first well region 110 may be formed in the active region ACT. The first well region 110 may be formed to extend through the active region ACT to a non-active region (e.g., an undoped portion) of the substrate 100. Thus, the first well region 110 may be formed in the substrate 100, and the first well region 110 may be formed on an undoped portion of the substrate below the first well region 110.

The first well region 110 may have a doping concentration of impurities relatively lower than those of the first semiconductor layer 140 and the second semiconductor layer 150. Here, the doping concentration may refer to the concentration of impurities doped (or implanted) in each region.

The first well region 110 may vertically overlap the first semiconductor layer 140. However, in certain embodiments, since the buried insulation layer 130 is interposed between the first well region 110 and the first semiconductor layer 140, the first well region 110 does not contact the first semiconductor layer 140. The term "contact," as used herein, refers to a direct physical connection (i.e., touching). Therefore, when an element is referred to as "contacting" or "in contact with" another element, there are no intervening elements present at the point or points of contact.

Figure 3:
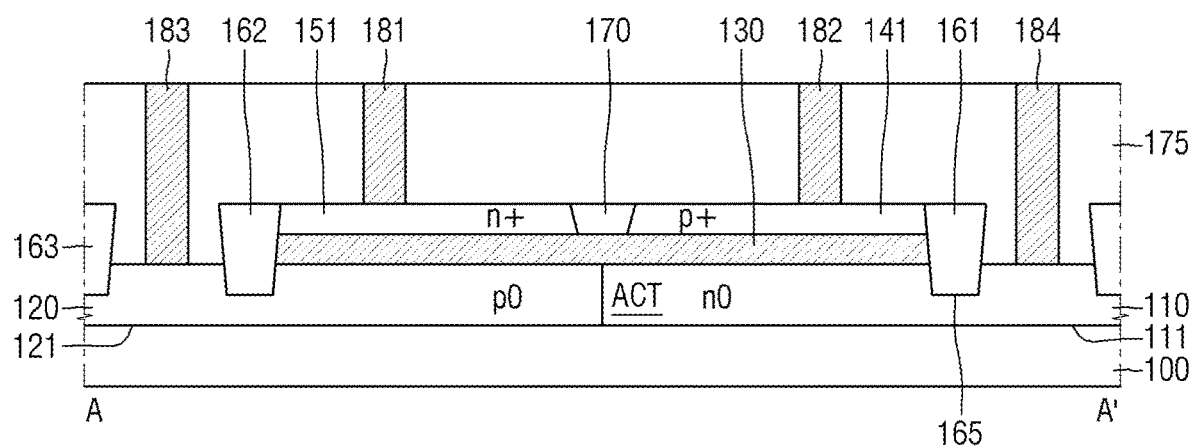
FIG. 3 is a cross-sectional view taken along line A-A' of FIG. 2.
Figure 3:
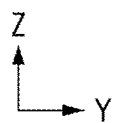

As illustrated in FIGS. 2 and 3, the first well region 110 may be formed on one side of the first element isolation layer 170, also described as a first isolation structure. The first well region 110 may vertically overlap a part of the first element isolation layer 170. The first well region 110 may be formed on one side of a conductive layer 190. The first well region 110 may vertically overlap a part of the conductive layer 190.

A part of the upper surface of the first well region 110 may be covered (e.g., directly covered) with the second element isolation layer 161 (also referred to as a second isolation structure) and the buried insulation layer 130. The remaining part of the upper surface of the first well region 110 may be exposed in relation to the SOI substrate and connected to a well contact 184 and covered by an interlayer insulation layer 175. The upper surface of the first well region 110 and the well contact 184 may contact each other, but the present inventive concepts are not limited thereto. A silicide layer may be formed between the upper surface of the first well region 110 and the well contact 184.

The first well region 110 may contact a part of the second element isolation layer 161 formed to extend inside. In one embodiment, the second element isolation layer 161 does not completely penetrate through the first well region 110. Therefore, a lowermost surface 111 of the first well region may be located to be deeper than a lowermost surface 165 of the second element isolation layer.

The second well region 120 may be formed in the active region ACT. The second well region 120 may be formed to extend through the active region ACT to the undoped portion of substrate 100. For example, the second well region 120 may be formed in the substrate 100 above an undoped portion of the substrate 100.

The second well region 120 may have a doping concentration relatively lower than those of the first semiconductor layer 140 and the second semiconductor layer 150.

The second well region 120 may vertically overlap the second semiconductor layer 150. However, in certain embodiments, since the buried insulation layer 130 is interposed between the second well region 120 and the second semiconductor layer 150, the second well region 120 does not contact the second semiconductor layer 150.

The second well region 120 may be formed on the other side of the first element isolation layer 170. For example, the first well region 110 may be formed on one side of the first element isolation layer 170, and the second well region 120 may be formed on the other side of the first element isolation layer 170, with the first element isolation layer 170 as a center and in between. The second well region 120 may vertically overlap a part of the first element isolation layer 170.

In certain embodiments, the second well region 120 may be formed on one side of the conductive layer 190. The second well region 120 may vertically overlap a part of the conductive layer 190.

A part of the upper surface of the second well region 120 may be covered with the second element isolation layer 162 (also described as a second isolation structure) and the buried insulation layer 130. The remaining part of the upper surface of the second well region 120 may be exposed in relation to the SIO substrate and connected to the well contact 183 and covered by interlayer insulation layer 175. The upper surface of the second well region 120 and the well contact 183 may contact each other, but the present inventive concepts are not limited thereto. A silicide layer may be formed between the upper surface of the second well region 120 and the well contact 183.

The second well region 120 may contact a part of the second element isolation layer 162 formed to extend into the second well region 120. In one embodiment, the second element isolation layer 162 does not completely penetrate through the second well region 120. Therefore, the lowermost surface 121 of the second well region may be positioned to be deeper than the lowermost surface of the second element isolation layer 162.

Figure 4:
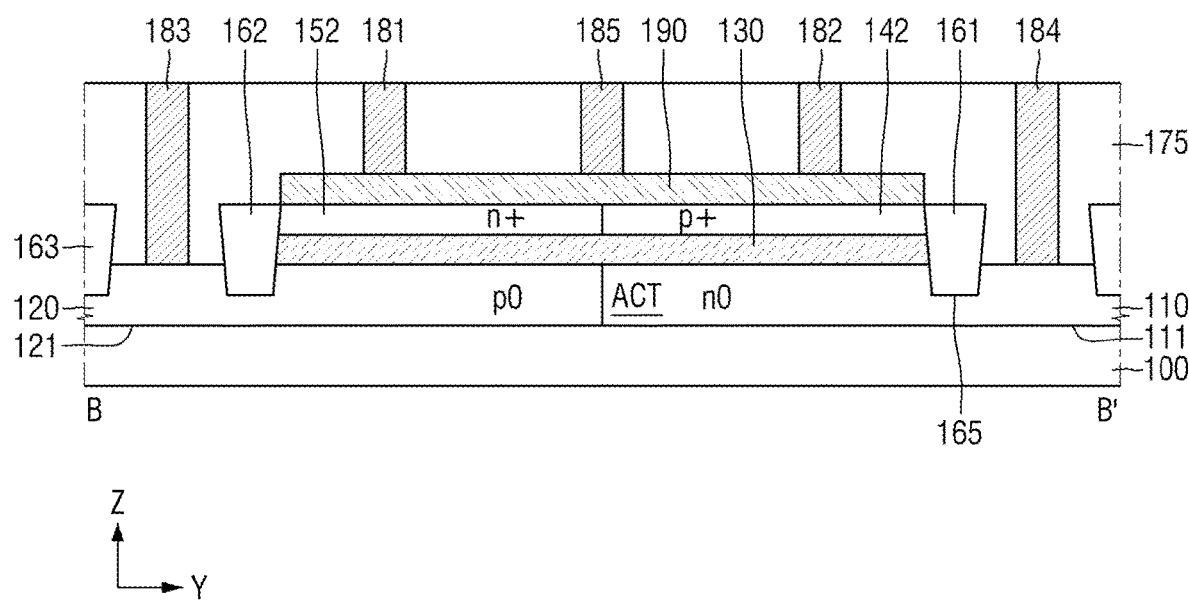
FIG. 4 is a cross-sectional view taken along line B-B' of FIG. 2.

According to some embodiments, a separate element isolation layer is not formed between the first well region 110 and the second well region 120. Therefore, a part of the first well region 110 and the second well region 120 may contact each other. As shown in FIGS. 3 and 4, in one embodiment, no other constituent element is interposed between the first well region 110 and the second well region 120.

A kind of PN junction may be formed between the first well region 110 and the second well region 120 which contact each other. Therefore, when a forward bias is formed between the first well region 110 and the second well region 120 by the well contacts 183 and 184, a current flow may be formed between the first well region 110 and the second well region 120.

A buried insulation layer 130 may be formed on the first well region 110 and the second well region 120.

The buried insulation layer 130 may include, but is not limited to, at least one of, for example, silicon oxide ($SiO_2$), silicon nitride (SiN), silicon oxynitride (SiON), and combinations thereof.

The buried insulation layer 130 may insulate between the first well region 110 and the first semiconductor layer 140. Since the buried insulation layer 130 is interposed between the first well region 110 and the first semiconductor layer 140, the first well region 110 and the first semiconductor layer 140 do not contact each other.

The buried insulation layer 130 may insulate between the second well region 120 and the second semiconductor layer 150. Since the buried insulation layer 130 is interposed between the second well region 120 and the second semiconductor layer 150, the second well region 120 and the second semiconductor layer 150 do not contact each other.

The buried insulation layer 130 may contact the second element isolation layers 161 and 162. Opposite sides of the buried insulation layer 130 may be defined by the side walls of the second element isolation layers 161 and 162. The second element isolation layers 161 and 162 may surround the periphery of the buried insulation layer 130. For example, though only a single cross-sectional view is shown depicting second element isolation layers 161 and 162, these layers may actually form a single continuous isolation layer that surrounds the periphery of the buried insulating layer 130 when viewed from a top-down view, which may be described collectively as a second element isolation layer or a second isolation structure.

The first semiconductor layer 140 may be formed on the buried insulation layer 130. The first semiconductor layer 140 may have a second conductivity type, and may be, for example, a P type as illustrated in FIG. 3.

Since the first well region 110 of the semiconductor device according to some embodiments of the present inventive concepts have the first conductivity type, the first well region 110 and the first semiconductor layer 140 may have conductivity types opposite to each other. Also, since the second well region 120 has the second conductivity type, the second well region 120 and the first semiconductor layer 140 may have the same conductivity type.

The first semiconductor layer 140 may have a doping concentration relatively higher than that of the first well region 110 and may have a doping concentration relatively higher than that of the second well region 120.

As illustrated in FIG. 3, the first semiconductor layer 140 may contact the first element isolation layer 170. The first semiconductor layer 140 may be disposed on one side of the first element isolation layer 170.

From FIG. 3 or the like, the height of the upper surface of the first semiconductor layer 140 or the second semiconductor layer 150 from a bottom surface of the substrate 100 is illustrated as being the same as the height of the upper surface of the first element isolation layer 170 or the second element isolation layers 161 and 162 from the bottom surface of the substrate 100, and the top surfaces of the first semiconductor layer 140, the second semiconductor layer 150, and the first element isolation layer 170 may be at the same vertical level and may be coplanar. However, the inventive concepts are not limited thereto. For example, the height of the upper surface of the first element isolation layer 170 or the second element isolation layers 161 and 162 from the bottom surface of the substrate 100 may be relatively higher than the height of the upper surface of the first semiconductor layer 140 or the second semiconductor layer 150 from the bottom surface of the substrate 100. It should be noted that terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

As illustrated in FIG. 4, the first semiconductor layer 140 may be covered with a conductive layer 190. The first semiconductor layer 140 may vertically overlap a part of the conductive layer 190.

The conductive layer 190 may be formed on the upper part of the first semiconductor layer 140 so that the resistance between the first semiconductor layer 140 and the contacts 182 and 187 that apply a voltage to the first semiconductor layer 140 is reduced.

A P-type transistor P1 may be formed by the gate structure 200 and the first semiconductor layer 140.

The second semiconductor layer 150 may be formed on the buried insulation layer 130. The second semiconductor layer 150 may have a first conductivity type, and may be, for example, an N type as illustrated in FIG. 3.

Since the second well region 120 of the semiconductor device according to some embodiments of the present inventive concepts have the second conductivity type, the second well region 120 and the second semiconductor layer 150 may have conductivity types opposite to each other. Further, since the first well region 110 has the first conductivity type, the first well region 110 and the second semiconductor layer 150 may have the same conductivity type.

The second semiconductor layer 150 may have a doping concentration relatively higher than that of the first well region 110 and relatively higher than that of the second well region 120.

As illustrated in FIG. 3, the second semiconductor layer 150 may contact the first element isolation layer 170. The first semiconductor layer 140 may be disposed on the other side of the first element isolation layer 170.

Further, as illustrated in FIG. 4, the second semiconductor layer 150 may be covered with the conductive layer 190. The second semiconductor layer 150 may vertically overlap a part of the conductive layer 190.

The second element isolation layers 161 and 162 may surround the peripheries of the first semiconductor layer 140 and the second semiconductor layer 150.

The N-type transistor N1 may be formed by the gate structure 200 and the second semiconductor layer 150.

A first part 141 of the first semiconductor layer 140 and a first part 151 of the second semiconductor layer 150 may be insulated by the first element isolation layer 170.

The first part 141 of the first semiconductor layer 140 may be disposed on one side of the gate structure 200, and the second part 142 of the first semiconductor layer 140 may be disposed on the other side thereof. Further, a first part 151 of the second semiconductor layer 150 may be disposed on one side of the gate structure 200, and a second part 152 of the second semiconductor layer 150 may be disposed on the other side thereof.

Further, a first element isolation layer 170 may be formed on one side of the gate structure 200, and a conductive layer 190 may be formed on the other side thereof. In one embodiment, from a top down view, the first element isolation layer 170 and the conductive layer 190 may face each other and may together form a structure with the gate structure 200 as a center (e.g., in the X-direction).

The conductive layer 190 may be formed on the upper part of the second semiconductor layer 150 such that the resistance between the second semiconductor layer 150 and the contacts 181 and 186 which apply a voltage to the second semiconductor layer 150 is reduced.

The gate structure 200 may be formed on the first semiconductor layer 140 and the second semiconductor layer 150. The gate structure 200 may be formed to cross the first semiconductor layer 140 and the second semiconductor layer 150. The gate structure 200 may include a gate electrode 201, a gate insulation layer 202 and a gate spacer 203.

The gate electrode 201 may include at least one of polycrystalline silicon (poly Si), amorphous silicon (a-Si), titanium (Ti), titanium nitride (TiN), tungsten nitride (WN), titanium aluminum (TiAl), titanium aluminum nitride (TiAlN), tantalum nitride (TaN), titanium carbide (TiC), tantalum carbide (TaC), tantalum carbonitride (TaCN), tantalum silicon nitride (TaSiN), tantalum (Ta), cobalt (Co), ruthenium (Ru), aluminum (Al) and tungsten (W). When the gate electrode 201 includes silicon, the gate electrode 201 may include a silicide material.

The gate electrode 201 may be formed through, for example, a replacement process (or a gate last process), but is not limited thereto. Unlike the configuration illustrated in FIGS. 5 and 6, the gate electrode 201 may also be formed via a gate first process.

The gate spacer 203 may be formed on the side wall of the gate electrode 201. The gate spacer 203 may include at least one of, for example, silicon nitride (SiN), silicon oxynitride (SiON), silicon oxide (SiO$_2$), silicon oxycarbonitride (SiOCN) and combinations thereof.

The gate insulation layer 202 may be formed between the first semiconductor layer 140 and the gate electrode 201, or between the second semiconductor layer 150 and the gate electrode 201.

The gate insulation layer 202 may be formed between the gate electrode 201 and the gate spacer 203. The gate insulation layer 202 may be formed along the side wall of the gate spacer 203.

The gate spacer 203 may include a gate trench 205 in which the gate electrode 201 is formed. The gate insulation layer 202 formed between the semiconductor layers 140 and 150 and the gate electrode 201 may be formed along the side wall and the bottom surface of the gate trench 250.

The gate insulation layer 202 may include, for example, silicon oxide, silicon oxynitride, silicon nitride, and a dielectric material having a dielectric constant higher than silicon oxide. The dielectric material may include, for example, but is not limited to, one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

A part of the gate structure 200 may be formed on the first element isolation layer 170. Since a part of the gate structure 200 is formed on the first element isolation layer 170, the corresponding gate structure 200 may be insulated from the first semiconductor layer 140 or the second semiconductor layer 150.

A source region 210 and a drain region 220 may be formed on opposite sides of the gate structure 200. The source region 210 and the drain region 220 may be formed in the first semiconductor layer 140. The source region 210 and the drain region 220 may function as a source and a drain of the N-type transistor N1.

Although not illustrated, a source region and a drain region may also be formed in the second semiconductor layer 150. The source region and the drain region formed in the second semiconductor layer 150 may function as a source and a drain of the P-type transistor P1.

In some embodiments of the present inventive concepts, at least a part of the source region 210 and the drain region 220 may have a structure protruding from the upper surface of the first semiconductor layer 140.

A first element isolation layer 170 may be formed between the first semiconductor layer 140 and the second semiconductor layer 150.

Specifically, the first element isolation layer 170 may be formed between the first part 141 of the first semiconductor layer 140 and the first part 151 of the second semiconductor layer 150. Therefore, the first part 141 of the first semiconductor layer 140 and the first part 151 of the second semiconductor layer 150 may be electrically insulated from each other.

The first element isolation layer 170 may be formed on the buried insulation layer 130. In some embodiments, the first element isolation layer 170 may be formed to extend into the interior of the buried insulation layer 130.

The first element isolation layer 170 may be formed to be shallower than the second element isolation layers 161 and 162. For example, the distance from the lower surface of the substrate 100 to the lowermost surface of the first element isolation layer 170 may be greater than the distance from the lower surface of the substrate 100 to the lowermost surfaces of the second element isolation layers 161 and 162. Accordingly, in a vertical direction, the lowermost surface of the first element isolation layer 170 may be at a higher vertical level (with respect to the substrate 100) than the lowermost surfaces of the second element isolation layers 161 and 162.

The second part 142 of the first semiconductor layer 140 corresponds to the drain of the P-type transistor P1, and the second part 152 of the second semiconductor layer 150 corresponds to the source of the N-type transistor N1.

Further, the conductive layer 190 may be formed over the first semiconductor layer 140 and the second semiconductor layer 150. The conductive layer 190 may include a conductive material, such as a metal, and may include, for example, silicide, but the present inventive concepts are not limited thereto.

Specifically, the conductive layer 190 may be formed on the second part 142 of the first semiconductor layer 140 and the second part 152 of the second semiconductor layer 150. Therefore, the second part 142 of the first semiconductor layer 140 and the second part 152 of the second semiconductor layer 150 may be electrically connected to each other.

The conductive layer 190 may be formed to overlap and extend over the first semiconductor layer 140 and the second semiconductor layer 150. Specifically, the conductive layer 190 may extend over the second part 142 of the first semiconductor layer and the second part 152 of the second semiconductor layer.

In some embodiments of the present inventive concepts, the first element isolation layer 170 and the conductive layer 190 may contact each other.

In the inverter circuit INV illustrated in FIG. 1, the source of the P-type transistor P1 and the drain of the N-type transistor N1 are connected to each other. When this is applied to the plan view of the semiconductor device of FIG. 2, the second part 142 of the first semiconductor layer 140 corresponds to the drain of the P-type transistor P1, and the second part 152 of the second semiconductor layer 150 corresponds to the source of the N-type transistor N1.

Since the conductive layer 190 electrically connects the second part 142 of the first semiconductor layer 140 and the second part 152 of the second semiconductor layer 150, an additional metal layer for electrically connecting the contact 187 formed on the first semiconductor layer 140 or the contact 186 formed on the second semiconductor layer 150 does not need to be formed.

Further, some of the contact 181 on the first semiconductor layer 140, the contact 182 on the second semiconductor layer 150 and the contact 185 on the conductive layer 190 may not be formed. For example, as the conductive layer 190 electrically connects between the second part 142 of the first semiconductor layer 140 and the second part 152 of the second semiconductor layer 150, since the voltage of the first semiconductor layer 140 or the voltage of the second semiconductor layer 150 may be kept the same, in some embodiments, only one contact at the vertical level above the first semiconductor layer 140 and the second semiconductor layer 150 is used to electrically connect the first semiconductor layer 140 of a first transistor with the second semiconductor layer 150 of a second transistor. Therefore, a single conductive contact (e.g., one of 181, 182, or 185) may be formed above, contact, and electrically connect to both the first semiconductor layer 140 and the second semiconductor layer 150 through the conductive layer 190. Accordingly, some of the contacts 181, 182 and 185 may not need to be formed. When some of the contacts 181, 182 and 185 are not formed, the semiconductor device according to certain embodiments of the present inventive concepts may have an area advantage.

An interlayer insulation layer 175 may be formed to cover the gate structure 200, the first semiconductor layer 140 and the second semiconductor layer 150. The interlayer insulation layer 175 may include, for example, at least one of silicon oxide, silicon nitride, silicon oxynitride, and low dielectric constant material having lower dielectric constant than silicon oxide. The low dielectric constant material may include, but is not limited to, for example, FOX (Flowable Oxide), TOSZ (Torene SilaZene), USG (Undoped Silica Glass), BSG (Borosilica Glass), PSG (PhosphoSilica Glass), BPSG (Boro Phospho Silica Glass), PETEOS (Plasma Enhanced Tetra Ethyl Ortho Silicate), FSG (Fluoride Silicate Glass), CDO (Carbon Doped Silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, or combinations thereof.

The interlayer insulation layer 175 may surround the well contacts 183 and 184. The interlayer insulation layer 175 may fill the space between the second element isolation layers 162 and 163. For example, the exposed upper surface of the first semiconductor layer 140 or the second semiconductor layer 150 may be covered with the interlayer insulation layer 175, and the well contacts 183 and 184 may be formed to penetrate through the interlayer insulation layer 175.

Hereinafter, a method of fabricating a semiconductor device according to some embodiments of the present inventive concepts will be described with reference to FIGS. 7 to 11B.

Figure 7:
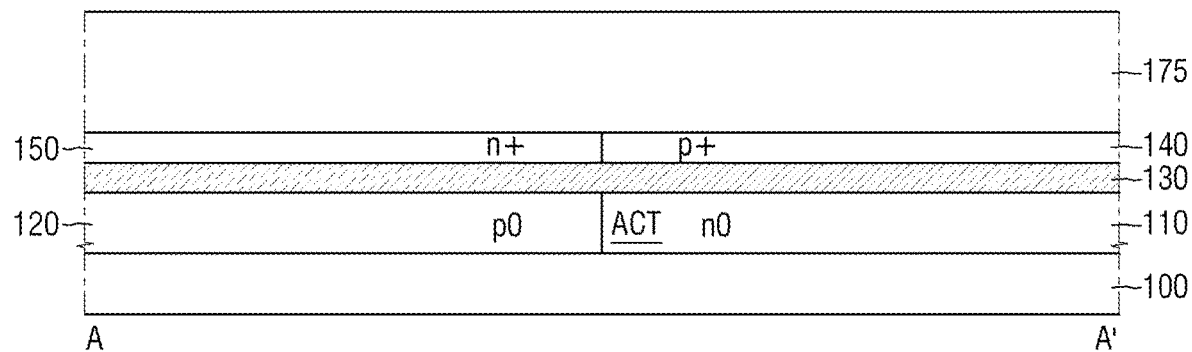
FIGS. 7 to 11b are intermediate step diagrams for explaining a method of fabricating a semiconductor device according to some embodiments of the present inventive concepts.
Figure 8:
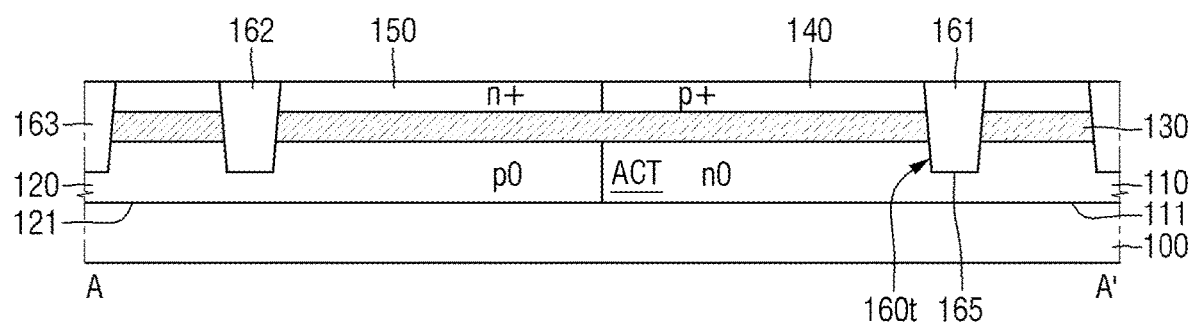

FIGS. 7 to 8 are intermediate step diagrams for explaining the method of fabricating the semiconductor device according to some embodiments of the present inventive concepts.

Referring to FIG. 7, the substrate 100, in which the first well region 110, the second well region 120, the buried insulation layer 130, the first semiconductor layer 140, and the second semiconductor layer 150 are sequentially formed, is provided. The substrate 100 may be formed, for example, from a wafer, such as a silicon wafer. A portion of the substrate 100 (e.g., the portion below the first and second well regions 110 and 120) may be in its original, pure form (e.g., just an undoped semiconductor material such as silicon). The first and second well regions 110 and 120 and buried insulation layer 130 may be formed from the original wafer, with other layers being formed thereon. Thus, these elements may be collectively referred to as being formed from or in a wafer substrate, with other elements being formed on the wafer substrate.

The first and second well regions 110 and 120 may be formed by doping the substrate 100 with respective impurities. For example, a first conductivity type material and a second conductivity type material may be doped in the substrate 100 to form the first well region 110 and the second well region 120, respectively.

Likewise, each of the first semiconductor layer 140 and the second semiconductor layer 150 may be formed by doping the second conductivity type material and the first conductivity type material.

In some embodiments, the substrate 100 may be a P-type substrate, and the first well region 110 may be an N-well formed in the P-type substrate. Conversely, the substrate 100 may be an N-type substrate, and the second well region 120 may be a P-well formed in the N-type substrate.

The buried insulation layer 130 may be formed by oxidizing the surface of the substrate 100 on which the first well region 110 and the second well region 120 are formed.

Further, in one embodiment, the substrate 100 may be formed by bonding the first semiconductor layer 140 and the second semiconductor layer 150 on the semiconductor wafer on which the buried insulation layer 130 is formed. However, the present inventive concepts are not limited thereto.

In some embodiments of the present inventive concepts, the first well region 110 may have a doping concentration relatively lower than those of the first semiconductor layer 140 and the second semiconductor layer 150. In addition, the second well region 120 may have a doping concentration relatively lower than those of the first semiconductor layer 140 and the second semiconductor layer 150.

Referring to FIG. 8, a trench 160t is formed in the substrate 100, and second element isolation layers 161, 162 and 163 for filling the trench 160t are formed. Formation of the trench 160t in the substrate 100 may include, for example, etching the substrate 100 using reactive ion etching, but the present inventive concepts are not limited thereto.

The trench 160t may be formed by etching the first well region 110 and the second well region 120.

Referring to FIGS. 2 and 8 together, one or more trenches 160t may be formed so as to surround the peripheries of the first semiconductor layer 140 and the second semiconductor layer 150, from a top-down view. For example, the second element isolation layers 161, 162 and 163 which surround the periphery of the first semiconductor layer 140 and the second semiconductor layer 150 may be formed. Second element isolation layers 161 and 162 may together fill a ring trench around the periphery of the first semiconductor layer 140 and the second semiconductor layer 150, and second element isolation layer 163 may fill a ring trench that surrounds the ring trench formed by second element isolation layers 161 and 162.

The second element isolation layers 161, 162 and 163 may be formed by filling trenches 160t with an insulating material. Formation of the second element isolation layers 161, 162 and 163 may include, for example, filling the trenches 160t with at least one of silicon oxide (SiO$_2$), silicon nitride (SiN), silicon oxynitride (SiON) and combinations thereof.

Figure 9A:
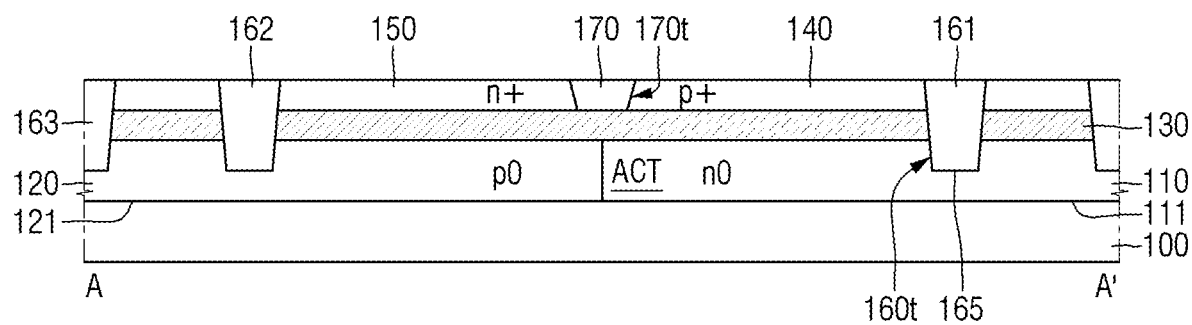
Figure 9B:
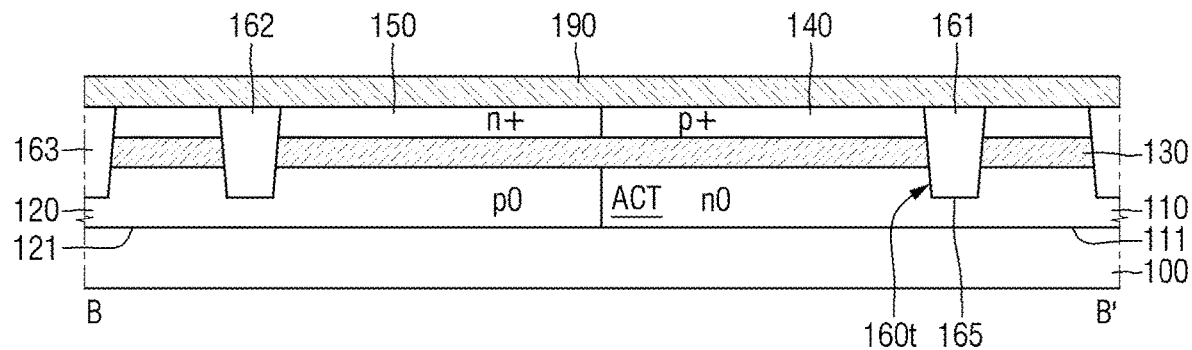

FIGS. 9a and 9b are intermediate step diagrams for explaining the method of fabricating the semiconductor device according to some embodiments of the present inventive concepts. FIG. 9a is a cross-sectional view taken along the line A-A' of FIG. 2, and FIG. 9b is a cross-sectional view taken along the line B-B' of FIG. 2.

Referring to FIG. 9a, a trench 170t is formed in the first semiconductor layer 140 and the second semiconductor layer 150. Formation of the trench 170t may include etching of the first semiconductor layer 140 and the second semiconductor layer 150 together, using the buried insulation layer 130 as an etching stop film.

Etching of the first semiconductor layer 140 and the second semiconductor layer 150 may be performed, for example, using reactive ion etching, but the present inventive concepts are not limited thereto.

Subsequently, the trench 170t may be filled with an insulating material to form the first element isolation layer 170. Formation of the first element isolation layer 170 may be filling of the trench 170t with at least one of, for example, silicon oxide (SiO$_2$), silicon nitride (SiN), silicon oxynitride (SiON) and combinations thereof.

Referring to FIG. 9b, the conductive layer 190 is formed over the first semiconductor layer 140 and the second semiconductor layer 150. Formation of the conductive layer 190 may include formation of silicide on the first semiconductor layer 140 and the second semiconductor layer 150, and the silicide may include, for example, Pt, Ni, Co, or the like.

Referring again to FIGS. 5 and 6, a gate structure 200 may be formed to cross the first semiconductor layer 140 and the second semiconductor layer 150. Formation of the gate structure may include formation of a dummy gate, formation of a gate spacer 203 on the side wall of the dummy gate, removal of the dummy gate to form a trench 205 defined by the gate spacer 203, and filling of the inside of the trench 205 with the gate insulation layer 202 and the gate electrode 201.

Figure 5:
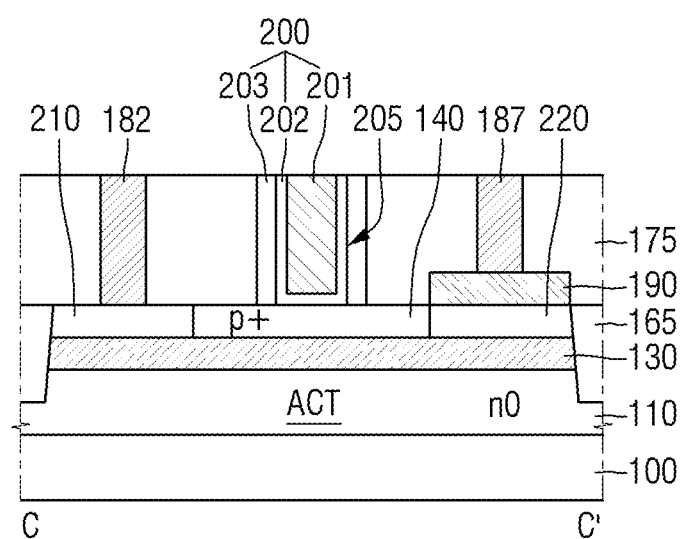
FIG. 5 is a cross-sectional view taken along line C-C' of FIG. 2.
Figure 6:
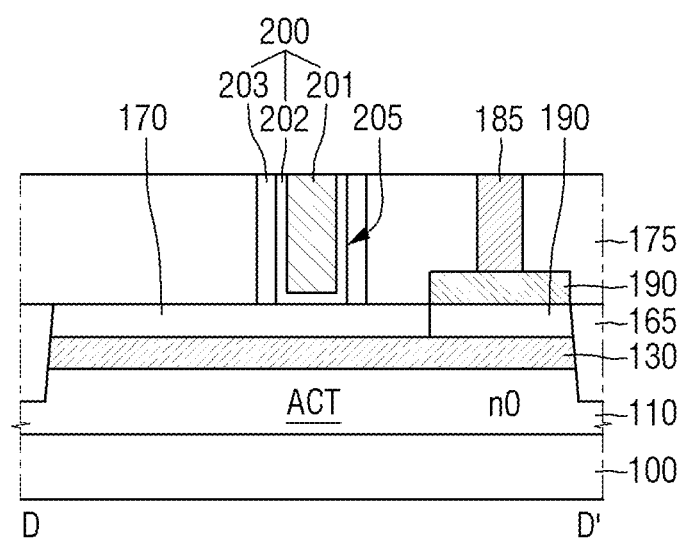
FIG. 6 is a cross-sectional view taken along line D-D' of FIG. 2.

Unlike the configuration illustrated in FIGS. 5 and 6, it is evident to those skilled in the art that the gate structure 200 may be formed through the gate first process rather than the gate replacement process or the gate last process.

Figure 10:
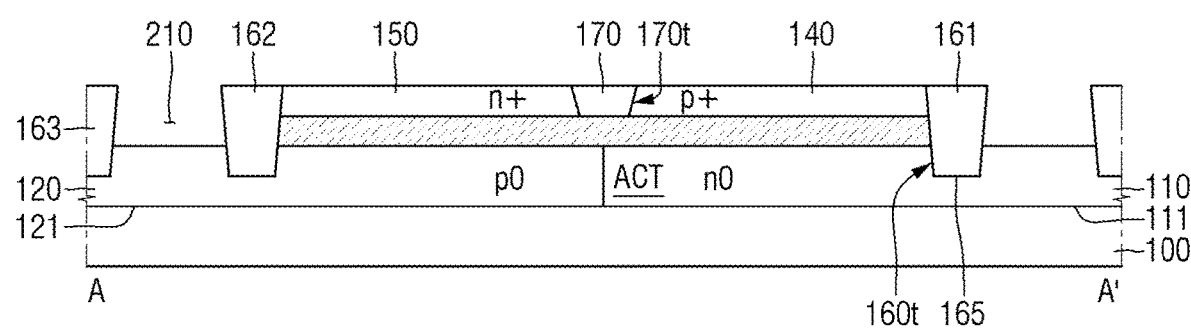

FIG. 10 is an intermediate step diagram illustrating the method of fabricating the semiconductor device according to some embodiments of the present inventive concepts.

Referring to FIG. 10, some of the conductive layer 190, the first semiconductor layer 140, the buried insulation layer 130, or the second semiconductor layer 150 and the buried insulation layer 130 are removed to form a recess 210. By forming the recess 210, a part of the upper surface of the first well region 110 or the second well region 120 may be exposed.

Figure 11A:
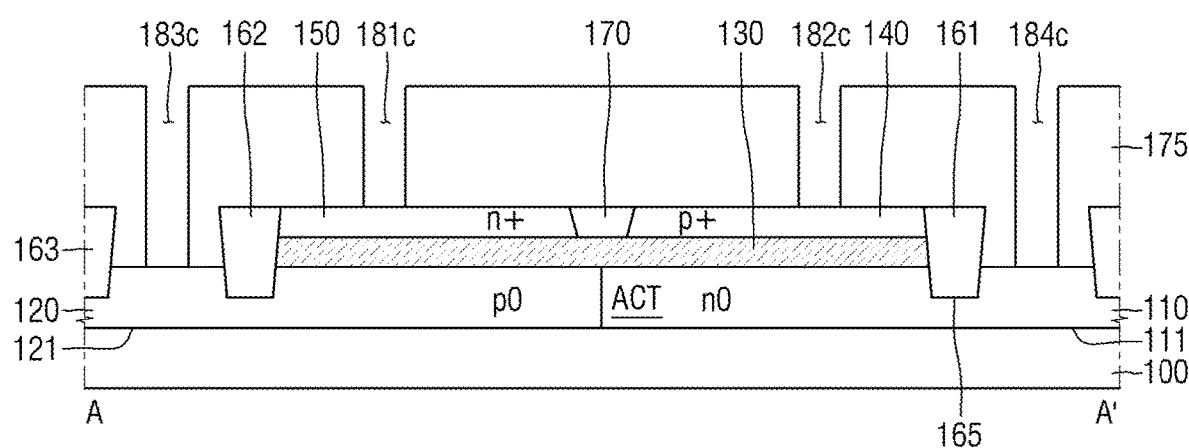
Figure 11B:
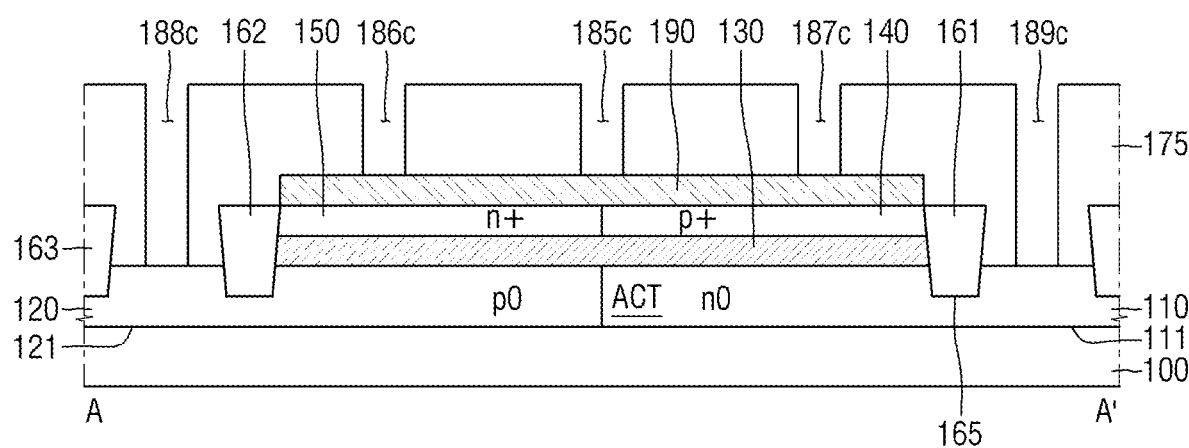

FIGS. 11a and 11b are intermediate step diagrams for explaining the method of fabricating the semiconductor device according to some embodiments of the present inventive concepts. FIG. 11a is a cross-sectional view taken along line A-A' of FIG. 2, and FIG. 11b is cross-sectional view taken along line B-B' of FIG. 2.

Referring to FIGS. 11a and 11b together, an interlayer insulation layer 175 is formed to cover the first semiconductor layer 140, the second semiconductor layer 150, and the gate electrode 200. The interlayer insulation layer 160 may be formed to fill the recess 210 which exposes the first and second well regions 110 and 120.

The interlayer insulation layer 175 may be formed, for example, but is not limited to, through a process such as a CVD (Chemical Vapor Deposition), using at least one of silicon oxide, silicon nitride, silicon oxynitride and a low dielectric constant material having a lower dielectric constant than silicon oxide.

Subsequently, the interlayer insulation layer 175 is etched to form contact holes 181c to 189c. The contact holes 181c to 189c may include contact holes 182c and 187c formed on the first semiconductor layer 140, contact holes 181c and 186c formed on the second semiconductor layer 150, a contact hole 185c formed on the conductive layer 185c, and a contact hole 188c formed on the first well region 110 or the second well region.

Finally, referring to FIGS. 3 and 4, the contact holes 181c through 189c are filled with the conductive material to form the contacts 181 through 189, which are conductive contacts. The conductive material may include, but is not limited to, for example, at least one of polycrystalline silicon, a metal silicide compound, a conductive metal nitride, and a metal.

In concluding the detailed description, those skilled in the art will appreciate that many variations and modifications may be made to the disclosed embodiments without substantially departing from the principles of the present inventive concepts. Therefore, the disclosed preferred embodiments of the inventive concepts are used in a generic and descriptive sense only and not for purposes of limitation.

What is claimed is:

1. A semiconductor device comprising:
a substrate;
a first well region of a first conductivity type and a second well region of a second conductivity type formed horizontally adjacent to each other in the substrate;
a buried insulation layer continuously formed on the first well region and the second well region;
a first semiconductor layer formed to vertically overlap the first well region, and a second semiconductor layer formed to vertically overlap the second well region, on the buried insulation layer;
a first isolation layer formed between the first semiconductor layer and the second semiconductor layer on the buried insulation layer; and
a conductive layer formed on the first semiconductor layer and the second semiconductor layer to extend over the first semiconductor layer and the second semiconductor layer,
wherein an upper surface of the buried insulation layer and a bottom surface of the first isolation layer are substantially coplanar, and
wherein on a portion of the first semiconductor layer and second semiconductor layer where the first isolation layer is not formed, the conductive layer entirely covers an upper surface of the portion of the first semiconductor layer and an upper surface of the second semiconductor layer from a first end of the first semiconductor layer to a first end of the second semiconductor layer opposite the first end of the first semiconductor layer.

2. The semiconductor device of claim 1, wherein the first semiconductor layer has the second conductivity type, and the second semiconductor layer has the first conductivity type.

3. The semiconductor device of claim 2, further comprising:
a gate structure formed across the first semiconductor layer and the second semiconductor layer such that the conductive layer is located on one side of the gate structure, on the first semiconductor layer and the second semiconductor layer.

4. The semiconductor device of claim 3, wherein:
the first semiconductor layer includes a first part and a second part respectively disposed on opposite sides of the gate structure,
the second semiconductor layer includes a first part and a second part respectively disposed on opposite sides of the gate structure, and
the second part of the first semiconductor layer and the second part of the second semiconductor layer are electrically connected to each other by the conductive layer.

5. The semiconductor device of claim 4, wherein the gate structure forms a first transistor on the first semiconductor layer, and forms a second transistor on the second semiconductor layer,
the second part of the first semiconductor layer is a drain of the first transistor, and
the second part of the second semiconductor layer is a source of the second transistor.

6. The semiconductor device of claim 1, wherein the conductive layer includes silicide.

7. The semiconductor device of claim 1, further comprising:
a second isolation layer formed in the first well region and the second well region to surround the first semiconductor layer and the second semiconductor layer.

8. The semiconductor device of claim 7, wherein a height of a lowermost surface of the first isolation layer from a bottom surface of the substrate is greater than a height of a lowermost surface of the second isolation layer from the bottom surface of the substrate.

9. The semiconductor device of claim 1, wherein the buried insulation layer, the first semiconductor layer and second semiconductor layer, and the substrate including the first well region and the second well region together form a silicon on insulator (SOI) substrate.

10. The semiconductor device of claim 1, further comprising:
a conductive contact formed above, contacting, and electrically connected to both the first semiconductor layer and the second semiconductor layer through the conductive layer.

11. A semiconductor device comprising:
a substrate;
a first well region of a first conductivity type and a second well region of a second conductivity type formed horizontally adjacent to each other in the substrate;
a buried insulation layer continuously formed on the first well region and the second well region;
a first semiconductor layer formed to vertically overlap the first well region and a second semiconductor layer formed to vertically overlap the second well region on the buried insulation layer, the first semiconductor layer and the second semiconductor layer being sequentially disposed adjacent to each other in a first direction;
a gate structure extending in the first direction on the first semiconductor layer and the second semiconductor layer;
a first isolation layer including at least a portion formed on a first side of the gate structure when viewed from a top down view, the first isolation layer separating the first semiconductor layer and the second semiconductor layer from each other; and a conductive layer comprising a first side and a second side opposite to the first side, which extends over the first semiconductor layer and the second semiconductor layer and is formed on a second, opposite side of the gate structure, wherein the first isolation layer is disposed on the first side of the conductive layer and not disposed on the second side of the conductive layer.

12. The semiconductor device of claim 11, wherein the first semiconductor layer has the second conductivity type, and the second semiconductor layer has the first conductivity type.

13. The semiconductor device of claim 11, wherein:

the first semiconductor layer includes a first part and a second part respectively disposed on opposite sides of the gate structure, the second semiconductor layer includes a first part and a second part respectively disposed on opposite sides of the gate structure, and the second part of the first semiconductor layer and the second part of the second semiconductor layer are electrically connected to each other by the conductive layer.

14. The semiconductor device of claim 11, wherein the first isolation layer is formed on the buried insulation layer.

15. The semiconductor device of claim 14, wherein the first semiconductor layer, the first isolation layer, and the second semiconductor layer are sequentially disposed in the first direction on the buried insulation layer.

16. The semiconductor device of claim 11, further comprising:

a second isolation layer formed in the first well region and the second well region to surround the first semiconductor layer and the second semiconductor layer.

17. The semiconductor device of claim 16, wherein a height of a lowermost surface of the first isolation layer from a bottom surface of the substrate is greater than a height of a lowermost surface of the second isolation layer from the bottom surface of the substrate.

18. The semiconductor device of claim 11, wherein the buried insulation layer, the first semiconductor layer and second semiconductor layer together, and the substrate including the first well region and the second well region form a silicon on insulator (SOI) substrate.

19. The semiconductor device of claim 11, further comprising:

a conductive contact formed above, contacting, and electrically connected to both the first semiconductor layer and the second semiconductor layer through the conductive layer.

20. A method of fabricating a semiconductor device, the method comprising:

forming a first well region of a first conductivity type and a second well region of a second conductivity type horizontally adjacent to each other in a substrate;

forming a buried insulation layer continuously on the first well region and the second well region;

forming a first semiconductor layer and a second semiconductor layer on the buried insulation layer, the first semiconductor layer vertically overlapping the first well region, and the second semiconductor layer vertically overlapping the second well region;

forming a trench between the first semiconductor layer and the second semiconductor layer, filling the trench to form a first isolation layer which separates at least a part of the first semiconductor layer and the second semiconductor layer; and forming a conductive layer on the first semiconductor layer and the second semiconductor layer to extend over the first semiconductor layer and the second semiconductor layer, wherein an upper surface of the buried insulation layer and a bottom surface of the first isolation layer are substantially coplanar, and wherein on a portion of the first semiconductor layer and second semiconductor layer where the first isolation layer is not formed, the conductive layer entirely covers an upper surface of the portion of the first semiconductor layer and an upper surface of the second semiconductor layer from a first end of the first semiconductor layer to a first end of the second semiconductor layer opposite the first end of the first semiconductor layer.

* * * * *